United States Patent [19]

Steitz et al.

[11] Patent Number: 5,358,826
[45] Date of Patent: Oct. 25, 1994

[54] METHOD OF FABRICATING METALLIZED CHIP CARRIES FROM WAFER-SHAPED SUBSTRATES

[75] Inventors: Richard R. Steitz, Chippewa Falls; Diane M. Christie, Eau Clairie; Eugene F. Neumann, Chippewa Falls; Melvin C. August, Chippewa Falls; Stephen Nelson, Chippewa Falls, all of Wis.

[73] Assignee: Cray Research, Inc., Eagan, Minn.

[21] Appl. No.: 884,285

[22] Filed: May 8, 1992

Related U.S. Application Data

[60] Continuation of Ser. No. 647,937, Jan. 30, 1991, abandoned, which is a division of Ser. No. 506,729, Apr. 9, 1990, Pat. No. 5,182,420, which is a continuation-in-part of Ser. No. 343,506, Apr. 25, 1989, abandoned.

[51] Int. Cl.$^5$ .................................................. G03F 7/00
[52] U.S. Cl. .................................... 430/312; 430/314; 430/318
[58] Field of Search ........................ 430/312, 314, 318

[56] References Cited

U.S. PATENT DOCUMENTS

| | | |
|---|---|---|
| 3,115,43 | 12/1963 | Ashworth . |
| 2,943,956 | 7/1960 | Robinson . |
| 3,256,588 | 6/1966 | Sikina et al. . |
| 3,283,639 | 11/1966 | Smith . |
| 3,333,225 | 7/1967 | McNutt . |
| 3,400,066 | 9/1968 | Caswell et al. . |
| 3,423,205 | 1/1969 | Skaggs et al. . |
| 3,522,085 | 7/1970 | Wantanabe . |
| 3,529,350 | 9/1970 | Rairden . |
| 3,585,010 | 6/1971 | Luce . |
| 3,622,410 | 11/1971 | Carlson . |
| 3,691,007 | 9/1972 | Pavlou . |
| 3,743,583 | 7/1973 | Castenguay . |
| 3,808,576 | 4/1974 | Castenguay et al. . |
| 3,857,683 | 12/1974 | Casteguay . |
| 4,026,412 | 5/1977 | Henson . |
| 4,126,758 | 11/1978 | Krumme . |
| 4,190,474 | 2/1980 | Berdan et al. . |
| 4,374,457 | 2/1983 | Wiech . |
| 4,410,622 | 10/1983 | Dalal et al. ........................ 430/312 |
| 4,417,392 | 11/1983 | Ibrahim et al. . |
| 4,582,564 | 4/1986 | Shanefield et al. . |
| 4,690,833 | 9/1987 | Donson et al. ........................ 430/312 |
| 4,699,871 | 10/1987 | Hulz ........................ 430/314 |
| 4,720,770 | 1/1988 | Jameson . |
| 4,810,616 | 3/1989 | Grabbe et al. ........................ 430/314 |

FOREIGN PATENT DOCUMENTS

2945385 5/1980 Fed. Rep. of Germany .

OTHER PUBLICATIONS

Article by R. W. Johnson et al., titled "Silicon Hybrid Wafer-Scale Package Technology", IEEE Journal of Solid State Electronics, vol. SC-21, No. 5, Oct. 1986.

H. J. Pawluk, "Thin Film Resistors Plated on Circuit Boards", *EE MicroWorld*, Jul. 1967.

(List continued on next page.)

*Primary Examiner*—Marion E. McCamish
*Assistant Examiner*—Kathleen Duda
*Attorney, Agent, or Firm*—Daniel J. Kluth; Kevin W. Raasch

[57] ABSTRACT

A method for simultaneously manufacturing metallized carriers from wafer-shaped substrates is described, wherein such wafer-shaped substrates permit the use of standard IC fabrication apparatus and methods. As a result, very thin and finely dimensioned traces can be deposited. Thin-film manufacturing techniques are used to create the high-density traces on the surface of the chip carriers, thereby permitting direct connections from the IC to the periphery of the carrier without the need for vias. A lid hermetically seals and protects the package. The traces are comprised of a plurality of metals to facilitate bonding, each of the metals homogeneous for a portion of the trace. One metal portion of the trace is of a type compatible with an IC chip placed in the carrier. Another metal portion of the trace is of a type compatible with a trace on a printed circuit board. A metal barrier is interposed between the metals to prevent metal diffusion from one metal to an adjoining portion of another metal.

29 Claims, 4 Drawing Sheets

OTHER PUBLICATIONS

J. L. Vossen and W. Kern, *Thin Film Processes,* pp. 463–476 (Academic Press, New York, 1978).

J. M. Poate, et al., "Thin Film Interdiffusion", *Journal of Applied Physics,* vol. 46, No. 10, pp. 4275–4283, Oct. 1975.

C. W. Horsting, "Purple Plague and Gold Purity", *10th Annual Proceedings, Reliability Physics,* pp. 155–158 (1972).

S. U. Campisano, et al., "*Kinetics Of Phase Formation In Au–Al Thin Films*", *Phil. Mag.,* pp. 903–917 (1975).

W. J. Takei et al., "Measurement of Diffusion–Induced Strains At Metal Bond Interfaces", *Solid State Electronics,* vol. 11, pp. 205–208, Pergamon Press, 1968.

S. Wakabayashi et al., "Effects of Grain Refiners in Gold Deposits on Aluminum Wire–Bond Reliability", *Plating and Surface Finishing,* pp. 63–68, (Aug. 1982).

P. K. Footner et al., "Purple Plague: Eliminated or Just Forgotten?", *Quality and Reliability Engineering International,* vol. 3, pp. 177–184 (1987).

V. N. Eremenko et al., "Kinetics of Formation of the $TiAl_3$ Phase in the Ti–Al System", *Soviet Powder Metallurgy and Metal Ceramics,* vol. 26, No. 2. pp. 118–122, (Feb. 1987) (English translation from *Poroshkovaya Mattalurgiya,* No. 2 (290), pp. 26–31, (Feb. 1987).

T. C. Tisone et al., "Diffusion in Thin Film Ti–Au, Ti–Pd, and Ti–Pt Couples", *The Journal of Vacuum Science and Technology,* vol. 9, No. 1, pp. 271–275 (1972).

H. C. Chang et al., "Diffusion Kinetics of Au through Pt Films About 2000 and 6000 Thick Studied With high–density interconnect packaging and product design.

Auger Spectroscopy", *Thin Solid Films,* vol. 31, pp. 265–273 (1976).

A. K. Sinha et al., "Thin Film Diffusion of Platinum in Gold", *Thin Solid Films,* vol. 22, pp. 1–10 (1974).

J. H. Selverian et al., "The Microstructure and Chemistry of the Reaction Between Ti and $A-Al_2O_3$", *Mat. Res. Soc. Symp. Proc.,* vol. 108, pp. 107–110 (1988).

S. P. Murarka et al., "Investigation of the Ti–Pt Diffusion Barrier for Gold Beam Leads on Aluminum", *J. Electro. Chem.: Solid–State Science and Technology,* vol. 125, No. 1, pp. 156–162 (1978).

P. K. Footner et al., "A Study of Gold Ball Bond Intermetallic Formation In PEDs Using Infra–Red Microscopy", *IEEE/IRPS Proceedings,* pp. 102–108 (1986).

R. W. Bower, "Characteristics of Aluminum–Titanium Electrical Contacts on Silicon", *Appl. Phys. Lett.,* vol. 23, No. 2, pp. 99–101 (Jul. 15, 1973).

S. P. Murarka et al., "Thin–Film Interaction In Aluminum and Platnium", *Journal of Applied Physics,* vol. 47, No. 12, pp. 5175–5181 (Dec. 1976).

P. M. Hall et al., "Diffusion Problems In Microelectronic Packaging", *Thin Solid Films,* vol. 53, pp. 175–182 (1978).

C. Weaver et al., "Diffusion in Gold–Aluminum", *Phil. Mag.,* pp. 377–389 (1970).

Exhibit A is a brochure by Kyocera describing their advanced packaging technologies for high speed/high integration circuits.

Exhibit B is a brochure by Kyocera describing design guidelines.

Exhibit C is a brochure by Kyocera describing new packaging technologies.

Exhibit D is a brochure by Raychem describing their

METHOD OF FABRICATING METALLIZED CHIP CARRIES FROM WAFER-SHAPED SUBSTRATES

CROSS-REFERENCE TO RELATED APPLICATIONS

This application is a continuation, of application Ser. No. 07/647,937, filed Jan. 30, 1991 now abandoned, which is a division of application Ser. No. 07/506,729, filed Apr. 9, 1990 now U.S. Pat. No. 5,182,420, which is a continuation-in-part of application Ser. No. 07/343,506 filed Apr. 25, 1989, now abandoned, which application is incorporated herein by reference.

BACKGROUND OF THE INVENTION

1. Field of the Invention

This invention relates generally to chip carriers for high-density integrated circuits (ICs). In particular, it is directed to metallized chip carriers fabricated from wafer-shaped substrates.

2. Description of Related Art

As integrated circuits become more dense, often containing hundreds of I/O connections, prior art techniques of packaging become less suitable. Packaging is considered by many in the industry to be the pacing technology for integrated circuit development. Many designers have recognized the need for developing new techniques for defining high-resolution traces on chip carriers. Up until the present invention, however, creating the required high-resolution traces presented significant manufacturing problems.

In the prior art, chip carriers are fabricated using substrates onto which metallized traces are placed to provide electrical connections from the periphery of the substrate to the integrated circuit packaged within. These traces are typically manufactured using thick-film technology. The need to provide increasing numbers of connections has resulted in thin-film technology being used as a partial solution to bring the traces from the integrated circuit to pins on the carrier. Prior art thin-film technology brings traces from the IC to vias within the carrier, and the vias provide connections to the pins. A primary shortcoming in the prior art is that thin-film technology can not be reliably used to bring the traces from the IC within the carrier to the periphery of the carrier.

Thus, there is a need in the art for high-density interconnects on chip carriers, which can provide traces directly from the integrated circuit packaged within the carrier to the periphery of the carrier, fabricated entirely with thin-film techniques. This shortcoming of the prior art requires that vias be used to connect traces to pin connections, making the overall footprint of the carrier larger than desirable. There is also a need in the prior art to manufacture chip carriers in quantity using thin-film technology, such that a high yield rate is attained with traces as narrow as 5 mils or less.

SUMMARY OF THE INVENTION

To overcome limitations in the prior art described above and to overcome other limitations that will become apparent upon reading and understanding the present specification, the present invention uses wafer-shaped substrates and thin-film manufacturing techniques to create high-density traces on chip carriers for direct connections from the IC to the periphery without the need of vias. One object of the present invention is to provide a method for manufacturing metallized chip carriers from substrates shaped similarly to semiconductor wafers. Wafer-shaped substrates permit the use of standard semiconductor fabrication apparatus and methods. As a result, very thin and finely dimensioned traces can be deposited simultaneously on a plurality of chip carriers.

DESCRIPTION OF THE DRAWINGS

In the drawings, where like numerals refer to like elements throughout the several views.

DETAILED DESCRIPTION OF THE PREFERRED EMBODIMENTS

In the following detailed description of the preferred embodiments, reference is made to the accompanying drawings which form a part hereof, and in which is shown by way of illustration four specific embodiments in which the invention may be practiced. It is to be understood that other embodiments may be utilized and structural changes may be made without departing from the scope of the present invention.

The present invention describes metallized chip carriers for high-density ICs and the steps required to fabricate these carriers. The preferred embodiment of the present invention uses thin-film techniques to deposit a large number of finely dimensioned traces on the surface of a substrate. Central to this invention is the use of standard semiconductor processing apparatus and methods in the fabrication of the chip carriers.

First Preferred Embodiment

Figure 1:
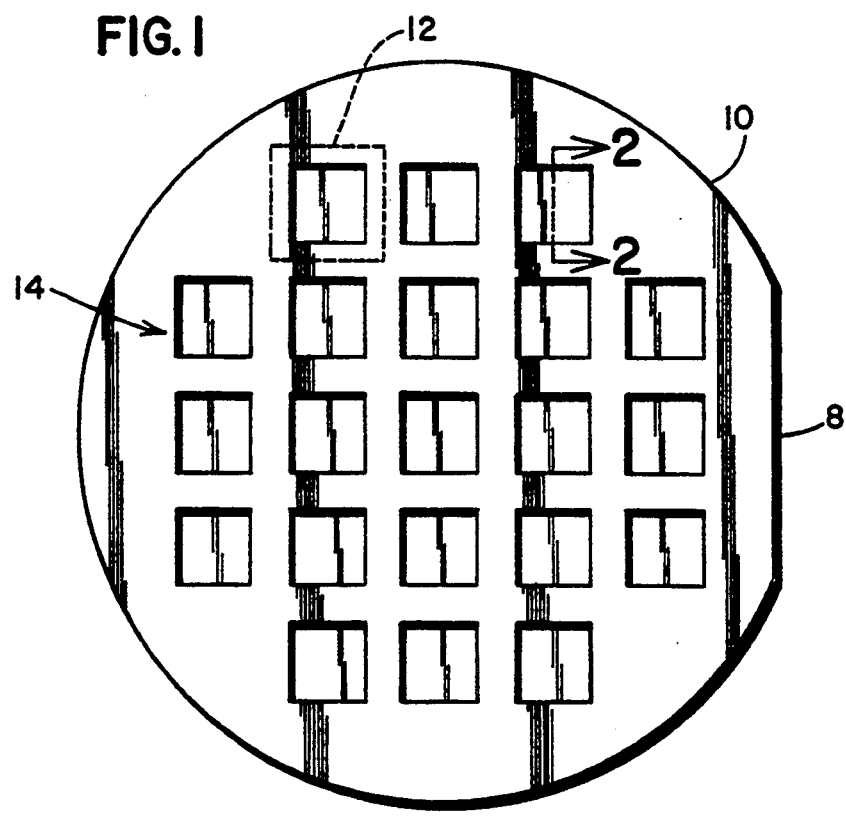
FIG. 1 is a top view of a wafer used in creating the chip carrier of the present invention.

Referring initially to FIG. 1, a substrate in a first preferred embodiment is shaped into a wafer 10. The substrate may be ceramic, such as aluminum oxide, aluminum nitrate, beryllium oxide, etc., or silicon. This wafer 10 is circularly shaped and keyed substantially similar to semiconductor wafers, which permits the use of IC fabrication apparatus and methods. The flat portion or key 8 of the wafer 10 is a reference key, ensuring the proper orientation of the wafer 10 during fabrication. Each wafer 10 is comprised of an array of cavities 14.

In the first preferred embodiment, the wafer 10 contains 21 cavities 14. Thus, a plurality of chip carriers, generally identified by reference number 12, can be fabricated simultaneously. Each cavity 14 is substantially square and measures 0.426 inches in length (±0.003 inches) on each side. These cavities 14 will eventually contain an IC chip. The top surface of the IC is approximately planar with the top surface of the chip carrier 12.

Figure 2:
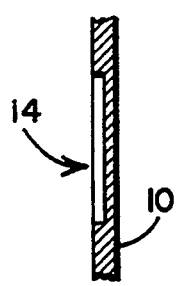
FIG. 2 is a cross-sectional side view of a portion of the ceramic wafer taken along lines 2—2 of FIG. 1.

FIG. 2 is a cross-sectional side view of wafer 10. The wafer 10 is 0.060 inches (+0.002/−0.001 inches) thick. Each cavity 14 is recessed within the wafer 10 to a depth of 0.030 inches (±0.002 inches).

If the substrate is ceramic, then the cavities may be fabricated by molding or other techniques known in the ceramic arts. For example, ceramic may be molded, milled, etc. Anvil and slurry milling will provide tighter tolerances than molding. When milled, the cavities are typically added after metallization, thereby avoiding problems with shrinkage of the cavities due to the sintering after punching or pressing the cavities.

If the substrate is comprised of silicon, then the cavities may be fabricated by etching or other techniques known in the silicon arts. The cavities can be etched in the silicon substrate as the first step in production or at any other step along the way, provided that the patterning material will sufficiently protect any metallization currently on the package. For example, if the cavities are etched in silicon after aluminum, titanium, platinum, and gold metallization layers have been deposited, the masking material must be able to sufficiently protect these metals with their large dimensions. An advantage of using silicon is the ability to use silicon's electrical properties for a substrate voltage bias, buried resistors, etc.

Figure 3A:
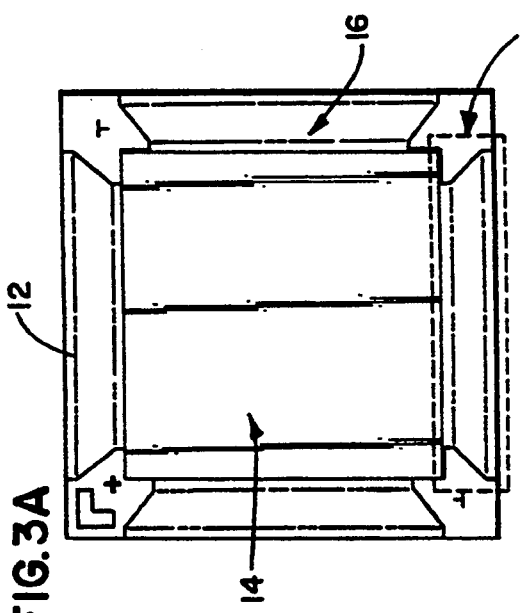
FIG. 3A is an individual chip carrier fabricated from the ceramic wafer and the trace pattern thereon.
Figure 3B:
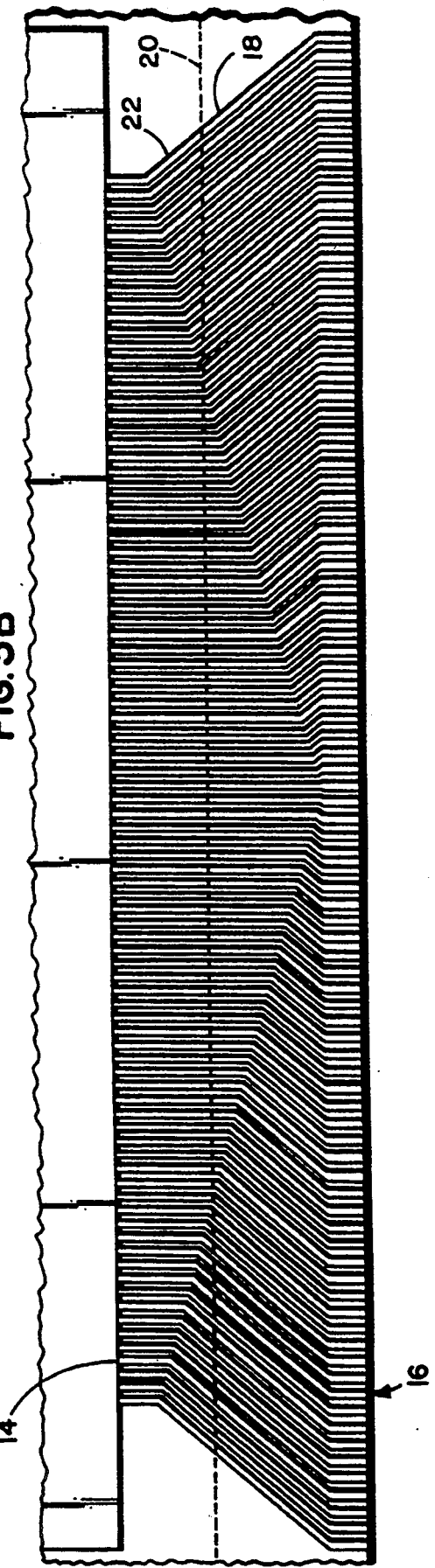
FIG. 3B is a magnified view of the trace pattern along one edge of the chip carrier taken along the dotted lines of FIG. 3A.

FIG. 3A shows a top view of a finished carrier 12 fabricated from the wafer 10. FIG. 3B shows a magnified view of the trace pattern along one edge of the carrier 12 taken along the dotted lines of FIG. 3A. The carrier 12 contains 90 traces per side (360 traces total), generally identified by reference number 16. The traces 16 are comprised of a plurality of metals. Using a plurality of metals in the trace 16 enhances bonding by allowing the trace 16 to metallically match both the bonding pads on the IC and the traces on the printed circuit board.

Figure 4:
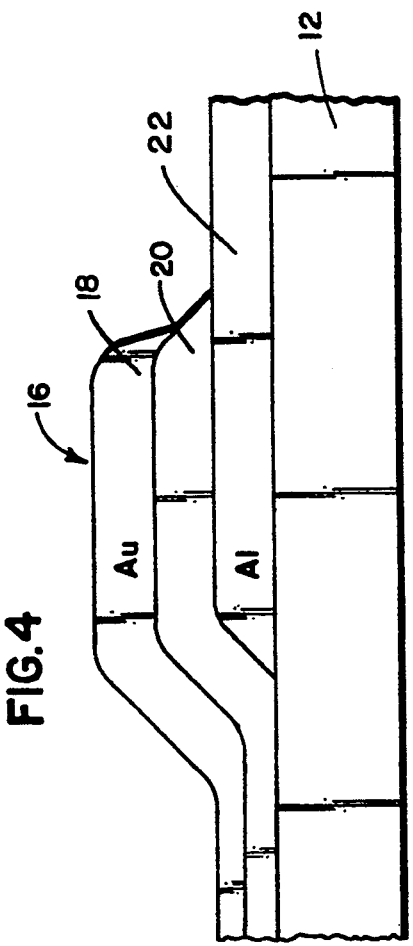
FIG. 4 is a cross-sectional side view of a trace on the chip carrier of FIG. 3A and FIG. 3B.
Figure 11:
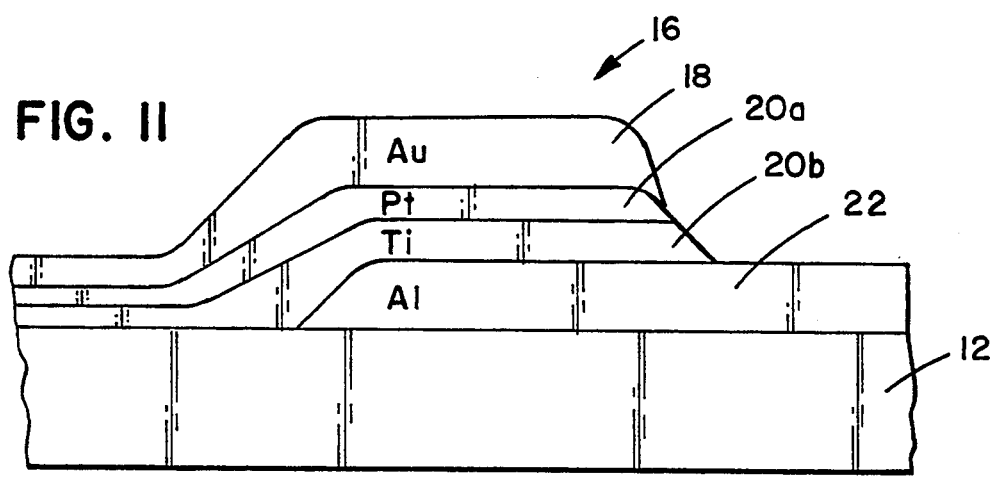
FIG. 11 is a cross-sectional side view of a trace on the chip carrier of FIG. 3A and FIG. 3B including a first alternate barrier metallurgy.
Figure 12:
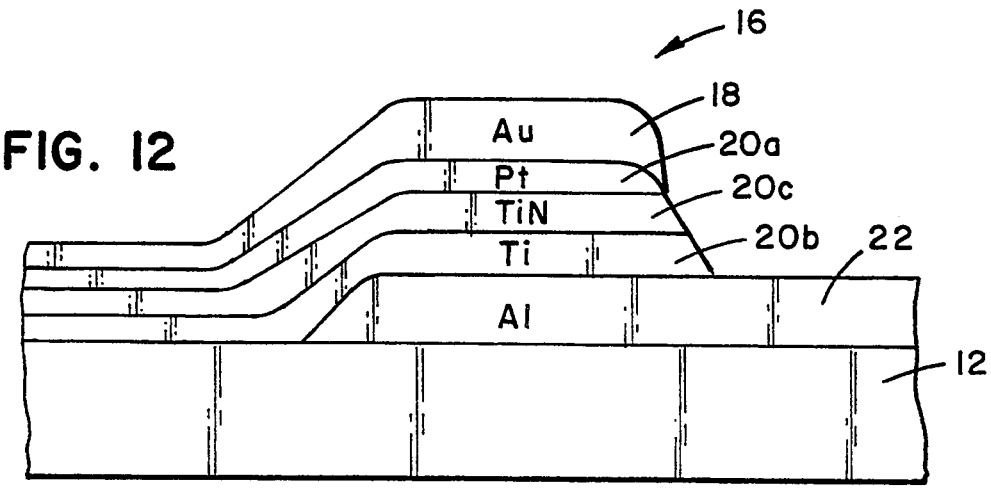
FIG. 12 is a cross-sectional side view of a trace on the chip carrier of FIG. 3A and FIG. 3B including a second alternate barrier metallurgy.

FIG. 4 is a magnified, cross-sectional side view of an individual trace 16 that better illustrates the barrier metallurgy 20. The aluminum portion 22 is created first, the barrier metallurgy 20 is added on top of the aluminum, and finally, the gold portion 18 is added atop the barrier metallurgy 20. FIGS. 11 and 12 illustrate individual traces fabricated with alternate barrier metallurgies.

Each metal is homogeneous for its portion of the trace 16. The inner length of each trace 16, generally identified by reference number 122 is preferably comprised of aluminum (Al). The outer length of each trace 16, generally identified by reference number 18, is preferably comprised of gold (Au). At the point where the inner length 22 meets the outer length 18, denoted by the dotted line 20 in FIG. 3, a barrier metallurgy is used. The barrier metallurgy 20 prevents the aluminum and gold from intermixing and forming "purple plague" and Kirkendall voiding. If Kirkendall voiding occurs, then the trace 16 could form an intermittent open due to localized heating from the electrical current, differences in expansion coefficients, and poor bond integrity. Those skilled in the art will readily recognize that other barrier metals could be used in the barrier metallurgy 20, depending upon a number of fabrication factors. For example, in a low temperature environment, titanium tungsten (TiW) or titanium under platinum could be used as shown in FIG. 11. At high temperatures, different combinations may be desired to improve adhesion and prevent diffusion of the metals. The rate of diffusion is at least partially determined by the temperature of the substrate. For example, nickel over chrome, platinum over titanium nitride over titanium (see FIG. 12), platinum over titanium tungsten over titanium or platinum over titanium tungsten nitride over titanium. Those skilled in the art will recognize that other metals such as palladium may be substituted for platinum to form the barrier metallurgy.

Aluminum is used for the inner portion 22 of the traces 16 because the electrical interconnections to the IC are aluminum. Thus, using aluminum for the inner portion 22 of the traces 16 prevents bonding problems between the IC and the chip carrier 12. Gold is used for the outer portion 18 of the traces 16 because the electrical interconnections to the printed circuit board are gold. Thus, using gold for the outer portions 18 of the traces 16 prevents bonding problems between the chip carrier 12 and a printed circuit board. Those skilled in the art will readily recognize that other metals could be used in the traces 16, such as an all gold trace if gold bonding was used on both the chip-to-carrier and carrier-to-board connections. The barrier metallurgy is used also to improve adhesion between the gold and ceramic. Thus, the barrier metallurgy is in direct contact with the ceramic or silicon substrate, with the gold on top of the barrier metallurgy.

The outer edges of the carrier 12 are 0.604 inches (+0.005/−0.005 inches) on each side. From the inner edge of the carrier 12, the traces 16 are brought out to the periphery of the carrier 12. The width of a trace 16, consistent from the inner edge of the carrier 12 and extending for a substantial portion of the length of the trace 16, is 0.002 inches (±0.0005 inches). The space between traces 16 at the inner edge of the carrier 12 is 0.002 inches (±0.0005 inches). At the outer edge of the carrier 12, the traces 16 are larger and less densely packed than at the inner edge. The width of a trace 16 at the outer edge of the carrier 12 is 0.0025 inches (±0.0005 inches). The space between traces 16 at the outer edge of the carrier 12 is 0.0025 inches (±0.0005 inches).

The traces 16 are larger at the outer edge of the carrier 12 because they connect to large, bulky traces on a printed circuit board. At the inner edge of the carrier 12, on the other hand, the traces 16 are sized to match bonding pads on the IC chip, which bonding pads are usually very small and densely packed. Thus, the traces 16 fan out from the inner edge to the outer periphery of the chip carrier 12 to facilitate electrical interconnection between an IC and a printed circuit board.

The creation of traces 16 surrounding each of the IC-receiving cavities 14 involves depositing metal layers in patterns on the wafer 10. Those skilled in the art will recognize that several techniques may be used for metal layer deposition, for example, sputtering, chemical-vapor deposition, plating, evaporation, etc., without departing from the scope of the present invention. The process steps are as follows in the order described in the preferred embodiment.

The wafer 10 is first cleaned and sputtered with aluminum. The wafer 10 is then patterned using spray-coating and photolithographic methods. The aluminum is etched and the photoresist removed. The wafer 10 is then sputtered with four layers of metal in the following order and thickness: titanium (2000Å), titanium nitride (500Å), platinum (2000Å), and gold (1500Å).

Next, the wafer 10 is patterned with photolithographic techniques so that the gold can be plated upwards. Gold is electroplated onto the sputtered gold, using the photoresist as a mask. The photoresist is removed and the exposed shorting metals are etched using ion beam milling, leaving the barrier metallurgy under all gold traces. Once the pattern of the traces 16 is complete, a passivation process may be used to prevent handling damage, for example, chemical-vapor deposition or sputtering the substrate with quartz or silicon nitride, etc. The final processing step is to separate the wafer 10 into its separate carriers 12. In the first preferred embodiment, a diamond saw separates wafer 10 into distinct carriers 12, but other techniques could also be used.

Once the individual carriers 12 are fabricated, with the traces 16 extending from the inner edge to the outer periphery of the carrier 12, an IC die is placed in the cavity 14 of the carrier 12 and bonded therein using known techniques. The connections between the bonding pads of the IC and the traces 16 on the carrier 12 can be made by a variety of techniques, for example, aluminum wire bonding, TAB tape bonding, or wire ribbon bonding. Once the electrical connections are made from the IC to the traces 16 on the carrier 12, the carrier 12 is ready for hermetic sealing.

Figure 5:
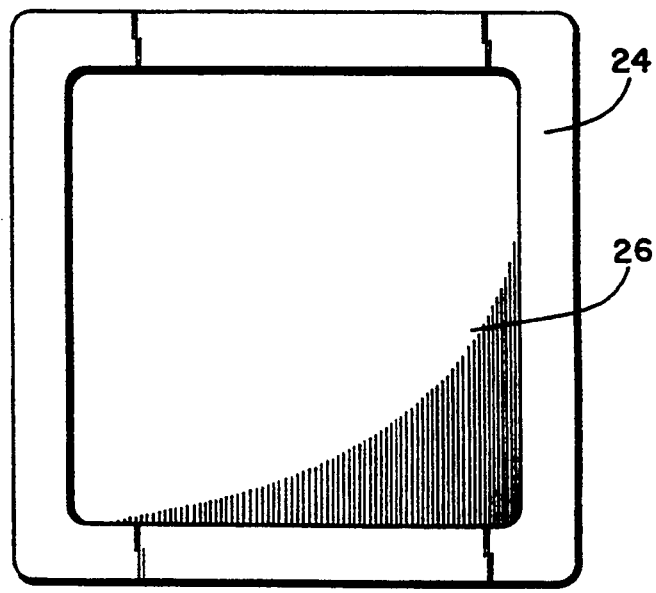
FIG. 5 is a top view of the lid for the ceramic carrier.

FIG. 5 is a diagram of the lid 24 used to hermetically seal the carrier 12. Preferably, the lid 24 is comprised of the same material as the carrier 12. The lid 24 is 0.532 inches along each outer edge. Each inner edge of the recess 26 within the lid 24 is 0.472 inches in length. Note that the size of the lid 24 is such that only the gold portions 22 of the traces 16 are exposed. The lid 24 covers the aluminum portions 22 of the traces 16, forming a hermetic seal and thereby preventing corrosion. The gold portions 22 of the traces 16 extend underneath the lid 24 to the outer periphery of the carrier 12, thereby facilitating bonding. The lid 24 is sealed with glass, instead of metal, so that the prior art technique of burying electrically conductive vias in a non-conducting substrate is not required. If a prior art metal lid was used with the surface traces 16 of the present invention, the metal lid would electrically short the exposed traces 16. Thus, in the present invention, the glass-sealed lid 24 allows the traces 16 to reside on the surface of the carrier 12.

Figure 6:
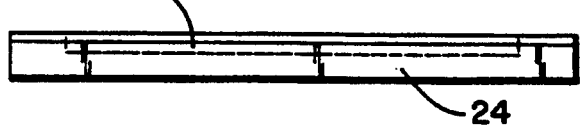
FIG. 6 is a cross-sectional side view of the lid of FIG. 5.

FIG. 6 is a cross-sectional side view of the lid 24 for the carrier 12. In the preferred embodiment, the lid 24 is 0.043 inches thick. The recess 26 within the lid 24 extends to a depth of 0.019 inches (±0.001 inches). The lid 24 is sealed to the carrier 12 by placing low-temperature sealing glass on the lid-to-ceramic interface and baking the package to melt the sealing glass at approximately 425° C.

Once it is hermetically sealed, the chip carrier 12 may be placed in a cavity or on the surface of a printed circuit board. The carrier-to-board connections may be made using bonding techniques well known in the art. Those skilled in the art will readily recognize that a wide variety of alternate techniques for hermetically sealing the carrier could be implemented. Depending upon the application, hermetically sealing the carrier may not be necessary.

Those skilled in the art will readily recognize that a wide variety of processing techniques may be used in conjunction with the teachings of the present invention. For example, thick film techniques may be used to produce much larger traces to supply, for example, power to the chips, distribute clock signals, etc. In addition, multi-layered ceramic substrates may be used in which interlayers supply power to the integrated circuit chips. Such inter-layers may include buried resistors and capacitors.

Second Preferred Embodiment

Figure 7:
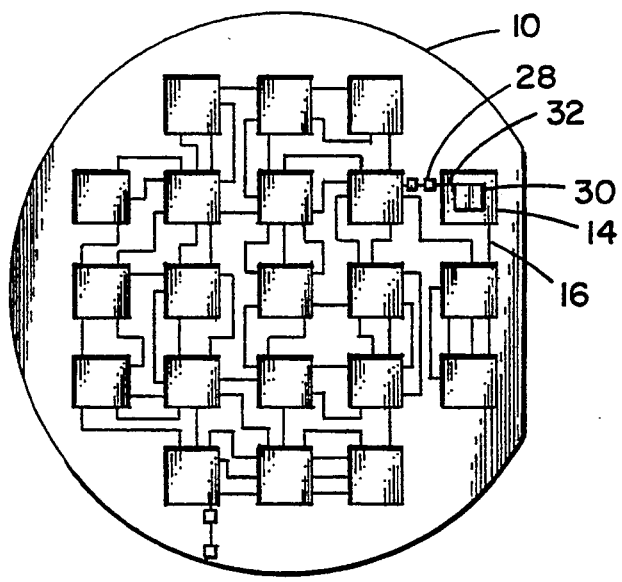
FIG. 7 is a top view of a wafer as fabricated in a second preferred embodiment of the present invention.

FIG. 7 describes a second preferred embodiment, wherein the wafer 10 is fabricated in manner similar to the first preferred embodiment. In the second, preferred embodiment, the wafer 10 contains a plurality of cavities 14 as in the first preferred embodiment. However, the wafer 10 is not cut or otherwise separated into a plurality of carriers, each with an individual cavity 14. Thus, the wafer 10 itself is a single carrier for a plurality of ICs 30.

Each cavity 14 is preferably the same dimensions as described in the first preferred embodiment. Metallized interconnects 16 electrically connect to bonding pads at the periphery of the cavities 14. The interconnects 16 may consist of single or multi-layer metallization. Pads 28 provide for lead bonding 32 or TAB (Tape Automated Bonding) 32 between ICs and traces 28 or between traces 28 and interconnects or devices external to the wafer 10. Preferably, the IC 30 is electrically connected to the carrier using a Tape Automated Bonding technique such as that described in the co-pending and commonly assigned patent application Ser. No. 07/366,604 filed Jun. 15, 1989 by E. F. Neumann et al. entitled "CHIP CARRIER WITH TERMINATING RESISTIVE ELEMENTS", which application is hereby incorporated by reference. A lid similar to the lid described in the first preferred embodiment may be used to seal each cavity 14. Individually sealing each cavity 14 enhances reworkability.

Third Preferred Embodiment

Figure 8:
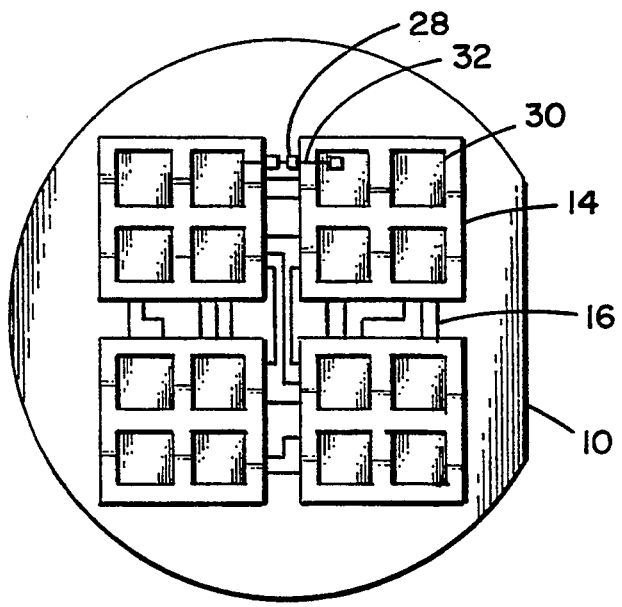
FIG. 8 is a top view of a wafer as fabricated in a third preferred embodiment of the present invention.

FIG. 8 describes a third preferred embodiment, wherein the wafer 10 is fabricated in a manner similar to the first and preferred embodiments. In the third preferred embodiment, the wafer 10 contains four large cavities 14, each cavity 14 holding a plurality of ICs 30. In the third preferred embodiment, like the second preferred embodiment, the wafer 10 is not cut or otherwise separated into a plurality of carriers. Thus, the wafer 10 itself is a single carrier for a plurality of ICs 30. Metallized interconnects 16 electrically connect the cavities 14. The interconnects 16 may consist of single or multi-layer metallization. Pads 28 provide for bonding between ICs and traces 28 or traces 28 and interconnects or devices external to the wafer 10. Preferably, the IC 30 is electrically connected to the carrier using a Tape Automated Bonding technique such as that described in the co-pending and commonly assigned patent application entitled "CHIP CARRIER WITH TERMINATING RESISTIVE ELEMENTS". Each cavity 14 is preferably sealed individually to enhance reworkability.

Fourth Preferred Embodiment

Figure 9:
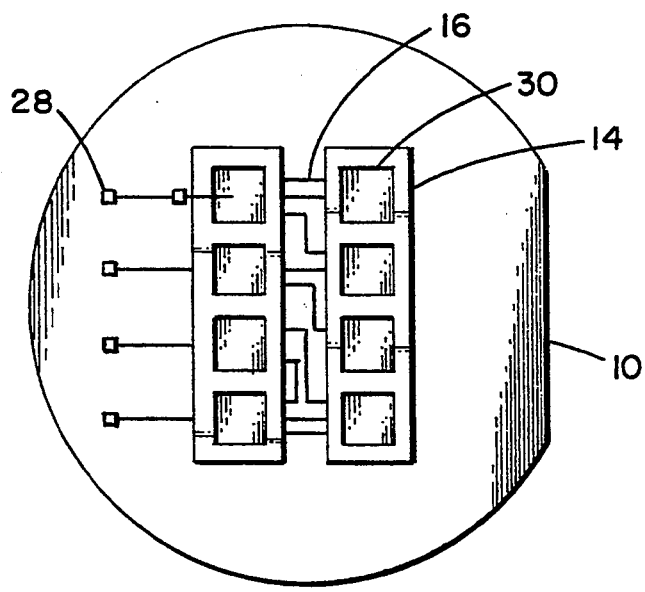
FIG. 9 is a top view of a wafer as fabricated in a fourth preferred embodiment of the present invention.

FIG. 9 describes a fourth preferred embodiment, wherein the wafer 10 is fabricated in a manner similar to the first, second, and third preferred embodiments. In the fourth preferred embodiment, the wafer 10 contains two large cavities 14, each cavity 14 holding a plurality of ICs arrayed in a linear manner. Such a configuration is especially useful for memory ICs with bonding pads on only two sides. In the fourth preferred embodiment, like the second and third preferred embodiments, the wafer 10 is not cut or otherwise separated into a plurality of carriers. Thus, the wafer 10 itself is a single carrier for a plurality of ICs 30. Metallized interconnects 16 electrically connect the cavities 14. The interconnects 16 may consist of single or multi-layer metallization. Pads 28 provide for bonding between ICs and traces 28 or traces 28 and interconnects or devices external to the wafer 10. Preferably, the IC 30 is electrically connected to the carrier using a Tape Automated Bonding technique such as that described in the co-pending and commonly assigned patent application entitled "CHIP CARRIER WITH TERMINATING RESISTIVE ELEMENTS". Each cavity 30 is preferably individually sealed to enhance reworkability.

Fifth Preferred Embodiment

Figure 10:
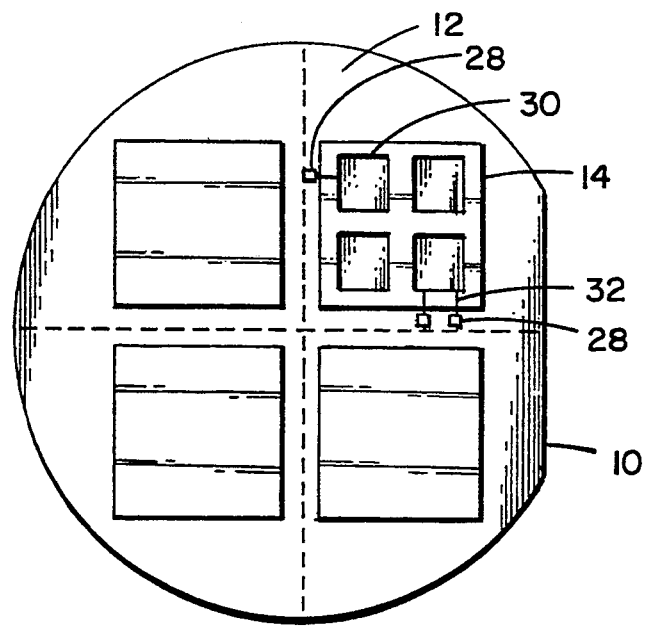
FIG. 10 is a top view of a wafer as fabricated in a fifth preferred embodiment of the present invention.

FIG. 10 describes the fifth preferred embodiment, wherein the wafer 10 is fabricated in a manner similar to the first, second, third and fourth preferred embodiments. In the fifth preferred embodiment, the wafer 10 contains a plurality of cavities, each cavity holding one or more integrated circuits. The wafer is metallized according to the teachings of the present invention to provide metal interconnects 16 between the peripheries of the cavities 14. The interconnects 16 may consist of single or multi-layer metallization. Pads 28 provide for lead bonding 32 or TAB (Tape Automated Bonding) 32 between ICs and traces 28 or between traces 28 and interconnects or devices external to the wafer 10. In a fashion similar to the first preferred embodiment, however, the wafer is cut along the dashed lines 50, dividing the wafer into quadrants. Thus in the fifth preferred embodiment, a wafer may be divided into sub-sections, or quadrants as shown in FIG. 10, to produce a plurality of multiple-cavity chip carriers.

Conclusion

Although a specific embodiment has been illustrated and described herein, it will be appreciated by those of ordinary skill in the art that any arrangement which is calculated to achieve the same purpose may be substituted for the specific embodiment shown. For example, different processing steps, different-electrical connection patterns, different trace metals, or different barrier metals than those disclosed in the detailed description could be used. This application is intended to cover any adaptations or variations of the present invention. Therefore, it is manifestly intended that this invention be limited only by the claims and the equivalents thereof.

What is claimed:

1. A method of fabricating a chip carrier for a plurality of integrated circuit chips, comprising:
    (a) fashioning a substrate into a circular wafer having first and second surfaces, with the thickness between the first and second surfaces being greater than that of each of said plurality of integrated circuit chips;
    (b) keying said wafer such that said wafer is shaped substantially similar to a semiconductor wafer;
    (c) depositing at least one thin-film trace on the first surface of said wafer using standard semiconductor processing apparatus, thereby electrically connecting each of said integrated circuit position chips to the periphery of said chip carrier; and
    (d) forming at least one cavity within said chip carrier, each of said at least one cavity comprising a depression in the first surface of said wafer having a depth less than the thickness of said wafer and further being sized to contain a plurality of said plurality of integrated circuit chips.

2. The method of claim 1, wherein the steps are performed in the order listed therein.

3. The method of claim 1, wherein said forming step is performed before said depositing step.

4. The method of claim 1, further comprising the step of placing a plurality of integrated circuit chips in each of said at least one cavity after said depositing step and said forming step.

5. The method of claim 1, further comprising the step of passivating said first surface of said wafer to protect each of said thin-film traces deposited thereon.

6. The method of claim 1, wherein said depositing step further comprises:
    (a) coating the first surface of said wafer with a photoresist;
    (b) covering the photoresist with a mask and exposing to light, thereby identifying at least a portion of said thin-film traces on the first surface of said wafer;
    (c) developing the photoresist on said wafer and removing the photoresist to define at least a portion of the thin-film traces;
    (d) metallizing the first surface of said wafer where the photoresist was removed, such that at least a portion of each of said thin-film traces are defined;
    (e) stripping the remaining photoresist from said wafer; and
    (f) repeating steps (a) through (e) for each metal layer deposited on said wafer.

7. The method of claim 1, wherein said depositing step further comprises depositing a plurality of thin-film traces having a width of not more than 0.0025 inches and spaced on 0.005 inch centers.

8. The method of claim 1, wherein said depositing step further comprises:
    (a) identifying inner and outer lengths of each thin-film trace, each inner length located proximate at least one of said plurality of integrated circuit chips and each outer length connecting each corresponding inner length to the periphery of said chip carrier,
    (b) forming each inner length of a first homogeneous metal layer on said substrate,
    (c) forming at least one homogeneous metal barrier layer on the first metal layer of said inner length and on said substrate identified as each outer length, and
    (d) forming each outer length of a second homogeneous metal layer on the barrier layer of said outer length and on the barrier layer of a section of the inner length closest to the periphery of said chip carrier.

9. The method of claim 8, further comprising the steps of:
   attaching said plurality of integrated circuit chips to said substrate;
   electrically attaching each of said plurality of integrated circuit chips to the inner lengths of at least one of said traces; and
   placing a cover on said carrier to hermetically seal the inner lengths of said traces and attached integrated circuit chips.

10. The method of claim 1, wherein said depositing step further comprises:
   (a) cleaning said wafer;
   (b) coating the first surface of said wafer with a first homogeneous metal layer;
   (c) defining a pattern on the first surface of said wafer for an inner length of each thin-film trace with a first photoresist using semiconductor photo-lithographic methods, the inner length located proximate at least one of said plurality of integrated circuit chips;
   (d) etching said first metal layer to form the inner length of said trace on said wafer and removing said first photoresist;
   (e) coating the first surface of said wafer with at least one barrier metal and the metal of a second homogeneous metal layer;
   (f) defining a pattern on the first surface of said wafer for the outer length of each thin-film trace with a second photoresist using semiconductor photolithographic techniques, the outer length connecting the inner length of said trace to the periphery of said chip carrier;
   (g) electroplating each outer length of second metal layer with additional second metal to complete formation of the outer length of said trace using said second photoresist as a mask;
   (h) removing said second photoresist; and
   (i) selectively etching the first surface of said wafer to remove each barrier metal layer and said second metal layer while leaving the inner and outer lengths of each thin-film trace on said wafer.

11. The method of claim 10, further comprising the steps of:
   attaching said plurality of integrated circuit chips to said substrate;
   electrically attaching each of said plurality of integrated circuit chips to the inner lengths of at least one of said traces; and
   placing a cover on said carrier to hermetically seal the inner lengths of said traces and attached integrated circuit chips.

12. The method according to claim 10, further comprising the steps of:
   (a) selecting said first metal such that said first metal is of a type compatible with a metal bonding pad on each of said plurality of integrated circuit chips;
   (b) selecting said barrier metals such that said barrier metals provide a barrier to prevent metal diffusion between said first and second metals; and
   (c) selecting said second metal such that said second metal is of a type compatible with a metal bonding pad on a printed circuit board to which said chip carrier would be attached.

13. A method of depositing a plurality of thin-film traces on a chip carrier, comprising:
   (a) forming a substrate shaped substantially similar to a semiconductor wafer;
   (b) cleaning said substrate;
   (c) using standard semiconductor processing apparatus and methods in the fabrication of said carrier from said wafer-shaped substrate;
   (d) sputtering said substrate with a first metallization layer;
   (e) defining a pattern for an inner length of each of said plurality of thin-film traces with a first photoresist using semiconductor photolithographic methods;
   (f) etching said first metallization layer to form an inner length of each of said plurality of thin-film traces and removing said first photoresist;
   (g) sputtering said substrate and inner lengths with at least one barrier layer and a second metallization layer;
   (h) defining a pattern for an outer length of each of said plurality of thin-film traces with a second photoresist using semiconductor photolithographic techniques;
   (i) electroplating said outer lengths with said second metallization layer using said second photoresist as a mask;
   (j) removing said photoresist; and
   (k) etching said second metallization layer to form outer lengths of each of said plurality of thin film traces.

14. The method of claim 13, further comprising the steps of attaching a plurality of integrated circuit chips to said substrate and electrically attaching each of said plurality of integrated circuit chips to the inner lengths of at least one of said plurality of thin-film traces.

15. The method of claim 14, further comprising the step of placing a cover on said carrier to hermetically seal the inner lengths of said plurality of thin-film traces and attached plurality of integrated circuit chips.

16. The method according to claim 1, further comprising the step of separating said wafer to form more than one of said chip carrier.

17. A method of fabricating a chip carrier for a plurality of integrated circuit chips, each of said plurality of integrated circuit chips occupying an integrated circuit position on said chip carrier, comprising:
   (a) fashioning a substrate into a circular wafer having first and second surfaces, with the thickness between the first and second surfaces being greater than that of each of said plurality of integrated circuit chips;
   (b) keying said wafer such that said wafer is shaped substantially similar to a semiconductor wafer;
   (c) depositing at least one thin-film trace on the first surface of said wafer using standard semiconductor processing apparatus, thereby electrically connecting each of said plurality of integrated circuit chips to the periphery of said chip carrier; and
   (d) forming a plurality of cavities within said chip carrier, each of said plurality of cavities comprising a depression in the first surface of said wafer having a depth less than the thickness of said wafer and further being sized to contain at least one of said plurality of integrated circuit chips.

18. The method of claim 17, wherein the steps are performed in the order listed therein.

19. The method of claim 17, wherein said forming step is performed before said depositing step.

20. The method of claim 17, further comprising the step of placing at least one integrated circuit chip in each of said plurality of cavities after said depositing step and said forming step.

21. The method of claim 17, further comprising the step of placing a passivation layer on the first surface of said wafer to protect each of said thin-film traces deposited thereon.

22. The method of claim 17, wherein said depositing step further comprises:
 (a) coating the first surface of said wafer with a photoresist;
 (b) covering the photoresist with a mask and exposing to light, thereby identifying at least a portion of said thin-film traces on the first surface of said wafer;
 (c) developing the photoresist on said wafer and removing the photoresist to define at least a portion of the thin-film traces;
 (d) metallizing the first surface of said wafer where the photoresist was removed, such that at least a portion of each of said thin-film traces are defined;
 (e) stripping the remaining photoresist from said wafer; and
 (f) repeating steps (a) through (e) for each metal layer deposited on said wafer.

23. The method of claim 17, wherein said depositing step further comprises depositing a plurality of thin-film traces having a width of not more than 0.0025 inches and spaced on 0.005 inch centers.

24. The method of claim 23, further comprising the steps of:
 attaching said plurality of integrated circuit chips to said substrate;
 electrically attaching each of said plurality of integrated circuit chips to the inner lengths of at least one of said traces; and
 placing a cover on said carrier to hermetically seal the inner lengths of said traces and attached integrated circuit chips.

25. The method of claim 17, wherein said depositing step further comprises:
 (a) identifying inner and outer lengths of each thin-film trace, each inner length located proximate at least one of said plurality of integrated circuit chips and each outer length connecting each corresponding inner length to the periphery of said chip carrier,
 (b) forming each inner length of a first homogeneous metal layer on said substrate,
 (c) forming at least one homogeneous metal barrier layer on the first metal layer of said inner length and on said substrate identified as each outer length, and
 (d) forming each outer length of a second homogeneous metal layer on the barrier layer of said outer length and on the barrier layer of a section of the inner length closest to the periphery of said chip carrier.

26. The method of claim 17, wherein said depositing step further comprises:
 (a) cleaning said wafer;
 (b) coating the first surface of said wafer with a first homogeneous metal layer;
 (c) defining a pattern on the first surface of said wafer for an inner length of each thin-film trace with a first photoresist using semiconductor photo-lithographic methods, the inner length located proximate at least one of said plurality of integrated circuit chips;
 (d) etching said first metal layer to form the inner length of said trace on said wafer and removing said first photoresist;
 (e) coating the first surface of said wafer with at least one barrier metal and the metal of a second homogeneous metal layer;
 (f) defining a pattern on the first surface of said wafer for the outer length of each thin-film trace with a second photoresist using semiconductor photolithographic techniques, the outer length connecting the inner length of said trace to the periphery of said chip carrier;
 (g) electroplating each outer length of second metal layer with additional second metal to complete formation of the outer length of said trace using said second photoresist as a mask;
 (h) removing said second photoresist; and
 (i) selectively etching the first surface of said wafer to remove each barrier metal layer and said second metal layer while leaving the inner and outer lengths of each thin-film trace on said wafer.

27. The method of claim 26, further comprising the steps of:
 attaching said plurality of integrated circuit chips to said substrate;
 electrically attaching each of said plurality of integrated circuit chips to the inner lengths of at least one of said traces; and
 placing a cover on said carrier to hermetically seal the inner lengths of said traces and attached integrated circuit chips.

28. The method according to claim 26, further comprising the steps of:
 (a) selecting said first metal such that said first metal is of a type compatible with a metal bonding pad on each of said plurality of integrated circuit chips;
 (b) selecting said barrier metals such that said barrier metals provide a barrier to prevent metal diffusion between said first and second metals; and
 (c) selecting said second metal such that said second metal is of a type compatible with a metal bonding pad on a printed circuit board to which said chip carrier would be attached.

29. The method according to claim 17, further comprising the step of separating said wafer to form more than one of said chip carrier.

* * * * *

UNITED STATES PATENT AND TRADEMARK OFFICE
CERTIFICATE OF CORRECTION

PATENT NO. : 5,358,826
DATED : October 25, 1994
INVENTOR(S) : Steitz et al.

Page 1 of 2

It is certified that error appears in the above-indentified patent and that said Letters Patent is hereby corrected as shown below:

On the cover page: Item [54] and Column 1, line 2, delete "CHIP CARRIES FROM" and insert --CHIP CARRIERS FROM-- therefor.

On cover page, line 56, delete "3,115,43 12/1963 Ashworth ., 2,943,956 7/1960 Robinson ." and insert --2,943,956 7/1960 Robinson ., 3,115,423 12/1963 Ashworth .--therefor.

On cover page, line 56, delete "3,857,683 12/1974 Casteguay . and insert --3,857,683 12/1974 Castenguay .-- therefor.

On cover page, line 56, delete "Hulz" and insert --Holz-- therefor.

On cover page 2, under OTHER PUBLICATIONS, delete "Platnium" and insert -- Platinum-- therefor.

Signed and Sealed this

Sixteenth Day of September, 1997

Attest:

BRUCE LEHMAN

*Attesting Officer*     Commissioner of Patents and Trademarks

UNITED STATES PATENT AND TRADEMARK OFFICE
CERTIFICATE OF CORRECTION

PATENT NO. : 5,358,826
DATED : October 25, 1994
INVENTOR(S) : Steitz et al

It is certified that error appears in the above-indentified patent and that said Letters Patent is hereby corrected as shown below:

On cover page 2, under OTHER PUBLICATIONS, delete "*J. Electro. Chem.:*" and insert --J. Electro. Chem. Soc.:-- therefor.

On cover page 2, under OTHER PUBLICATIONS, delete "high-density interconnect packaging and product design". therefor.

On cover page 2, under OTHER PUBLICATIONS, end of colmn 2, insert --high-density interconnect packaging and product design.-- therefor.

Signed and Sealed this

Sixteenth Day of September, 1997

Attest:

BRUCE LEHMAN

*Attesting Officer*  *Commissioner of Patents and Trademarks*